United States Patent [19]

Pollard

[11] Patent Number: 4,627,533
[45] Date of Patent: Dec. 9, 1986

[54] CERAMIC PACKAGE FOR COMPENSATED CRYSTAL OSCILLATOR

[75] Inventor: Gary B. Pollard, Santa Ana, Calif.

[73] Assignee: Hughes Aircraft Company, Los Angeles, Calif.

[21] Appl. No.: 665,594

[22] Filed: Oct. 29, 1984

[51] Int. Cl.⁴ ............................................. B65D 73/02
[52] U.S. Cl. .................................. 206/328; 206/330; 206/334; 29/25.35
[58] Field of Search .............. 206/328, 329, 330, 332, 206/334, 346, 588, 590; 29/25.35; 228/121, 181

[56] References Cited

U.S. PATENT DOCUMENTS

| | | | |
|---|---|---|---|
| 3,349,481 | 10/1967 | Karp | 206/329 |
| 3,417,865 | 12/1968 | Suverkropp et al. | 206/329 |
| 3,454,154 | 7/1969 | Peters et al. | 206/330 |
| 3,469,684 | 9/1969 | Keady et al. | 206/330 |
| 3,659,821 | 5/1972 | Sakamoto et al. | 206/330 |
| 3,691,289 | 9/1972 | Rohloff | 206/328 |
| 3,951,327 | 4/1976 | Snow et al. | 228/121 |
| 3,970,880 | 4/1976 | Deutschmann et al. | 310/9.4 |
| 4,046,254 | 9/1977 | Kramer | 206/370 |
| 4,094,436 | 6/1978 | Brimingham | 220/415 |
| 4,293,986 | 10/1981 | Kobayashi et al. | 29/25.35 |
| 4,484,158 | 11/1984 | Roberts et al. | 29/25.35 |
| 4,489,830 | 12/1984 | Charlebois et al. | 206/329 |
| 4,571,794 | 2/1986 | Nakamura | 29/25.35 |
| 4,574,438 | 3/1986 | Diepers et al. | 29/23.35 |

Primary Examiner—Joseph Man-Fu Moy
Assistant Examiner—David T. Fidei
Attorney, Agent, or Firm—A. W. Karambelas; K. W. Float

[57] ABSTRACT

Ceramic package (10) for compensated crystal oscillator has a three-layer body with a closed bottom upper cavity (24), a closed bottom lower cavity (38), and a through cavity (44) in which is mounted oscillator crystal. The upper cavity carries oscillator network on thin film hybrid (68) while the lower cavity carries the temperature compensation network on thick film hybrid (70). After the components are installed and connected, the oscillator network is adjusted, and then the crystal is adjusted in vacuuo. The crystal cavity is closed with thermocompression bonded covers to maintain the vacuum and the oscillator network cavity is filled with dry inert gas and is sealed by attaching a cover by thermocompression bonding. With both cavities sealed, the compensator network is adjusted as required. Thereupon, the compensation network is also covered and hermetically sealed.

16 Claims, 3 Drawing Figures

CERAMIC PACKAGE FOR COMPENSATED CRYSTAL OSCILLATOR

This invention is directed to a ceramic package with several separate cavities therein including an evacuated cavity for the crystal, a nitrogen-filled cavity for the thin film oscillator network, and a cavity for a thick film compensation network so that the compensation network can be adjusted after the oscillator crystal and oscillator network are adjusted and sealed.

BACKGROUND OF THE INVENTION

The oscillator crystal which serves as the frequency standard in a crystal oscillator system must be packaged in vacuum in order to maintain its frequency stability. The vacuum packaging prevents aging brought about by changes of the mass of the resonator due to variations in the amount of adsorbed gas resulting from temperature and pressure fluctuations. By the present state of the art, the crystal is assembled, placed in its package, and the crystal frequency is adjusted by adding or subtracting to the electrodes on opposite sides of the crystal wafer. The adjustment is done in vacuum, and the package is closed after the crystal adjustment. U.S. Pat. No. 3,951,327 to Snow teaches sealing an oscillator crystal in vacuum and includes the use of thermocompression bonding as the sealing method between the parts of the package. U.S. Pat. No. 3,970,880 to Deutschmann and U.S. Pat. No. 4,293,986 to Kobayashi further teach such packaging.

There is need for a structure and a system whereby the oscillator network can be adjusted and sealed, its oscillator crystal can be adjusted and sealed, and there is still opportunity for adjustment, with the entire structure within a single package, for convenience in handling and conservation of size and weight.

SUMMARY OF THE INVENTION

In order to aid in the understanding of this invention, it can be stated in essentially summary form that it is directed to a ceramic package for a compensated crystal oscillator wherein the package has three cavities therein. The first cavity is for the oscillator network and is evacuated, the network adjusted and then the first cavity is closed and sealed. The second cavity is for the quartz oscillator crystal which is thereafter also cleaned, evacuated, adjusted, closed and sealed. The third cavity is for the compensation network. This permits the frequency of oscillation to be adjusted exactly by changing the crystal without disturbing optimal component values (for DC bias or temperature compensation) in the oscillator, and permits adjustment of the compensation network after sealing of the crystal and oscillator network, to provide a single package carrying all of the crystal oscillator circuitry.

It is, thus, a purpose and advantage of this invention to provide a ceramic package which contains all of the structure and circuitry necessary for a compensated crystal oscillator so that the complete package is substantially smaller than the present multiple part systems wherein the oscillator crystal is separately packaged.

It is another purpose and advantage of this invention to provide a ceramic package which contains separate cavities for the oscillator crystal, the oscillator network and the compensation network so that precision thin film circuitry can be employed in the oscillator network. The thin film oscillator network can be separately adjusted and sealed prior to the adjustment of the oscillator crystal, to protect the thin film oscillator network while the oscillator crystal and the compensation network is left open for adjustment during testing.

It is a further purpose and advantage of this invention to provide the ability to adjust the crystal to the oscillator rather than, as in present art, the oscillator to the crystal. It is much easier to change the crystal prior to seal than to adjust the circuit elements of the thin film oscillator. Such an adjustment may have adverse effect on performance, e.g. bias current, cold starting, etc. It is more satisfactory to adjust these parameters in the thin film oscillator and later adjust the oscillator crystal.

It is a further purpose and advantage of this invention to provide a ceramic package generally in the form of a leadless chip carrier so that a compensated crystal oscillator can be quickly and easily inserted and removed from an electronic system employing the oscillator. Other purposes and advantages of this invention will become apparent from a study of the following portions of the specification, the claims and the attached drawings.

DETAILED DESCRIPTION OF THE INVENTION

Figure 1:
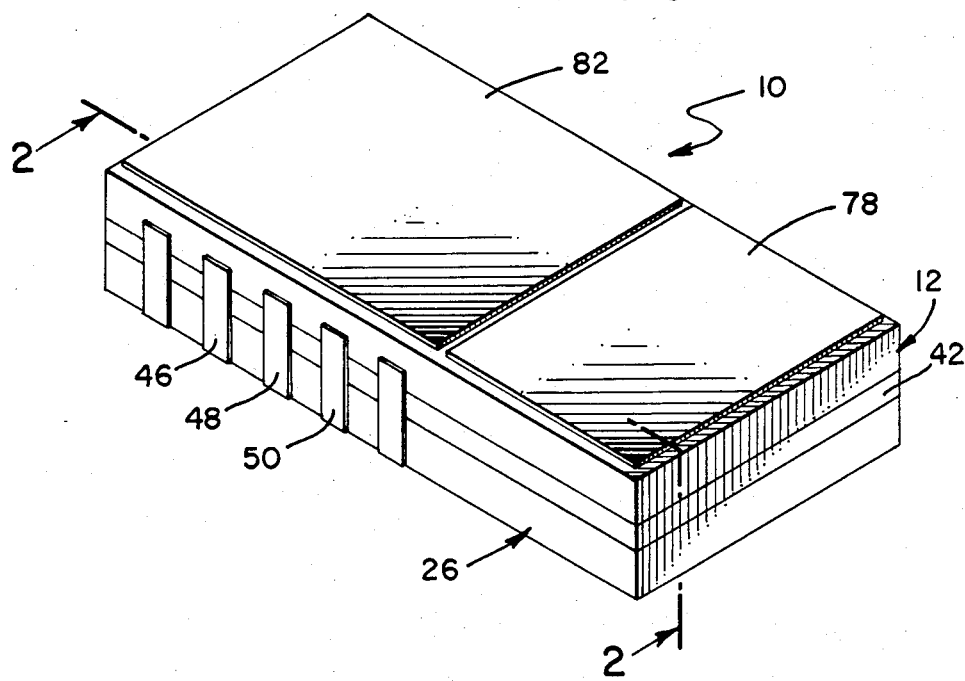
FIG. 1 is an isometric view of the ceramic package in accordance with this invention, showing it completed and closed.
Figure 2:
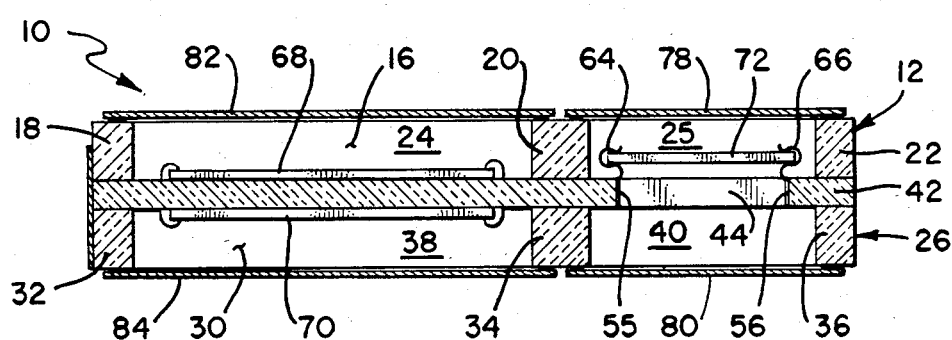
FIG. 2 is a section taken generally along the line 2—2 of FIG. 1.
Figure 3:
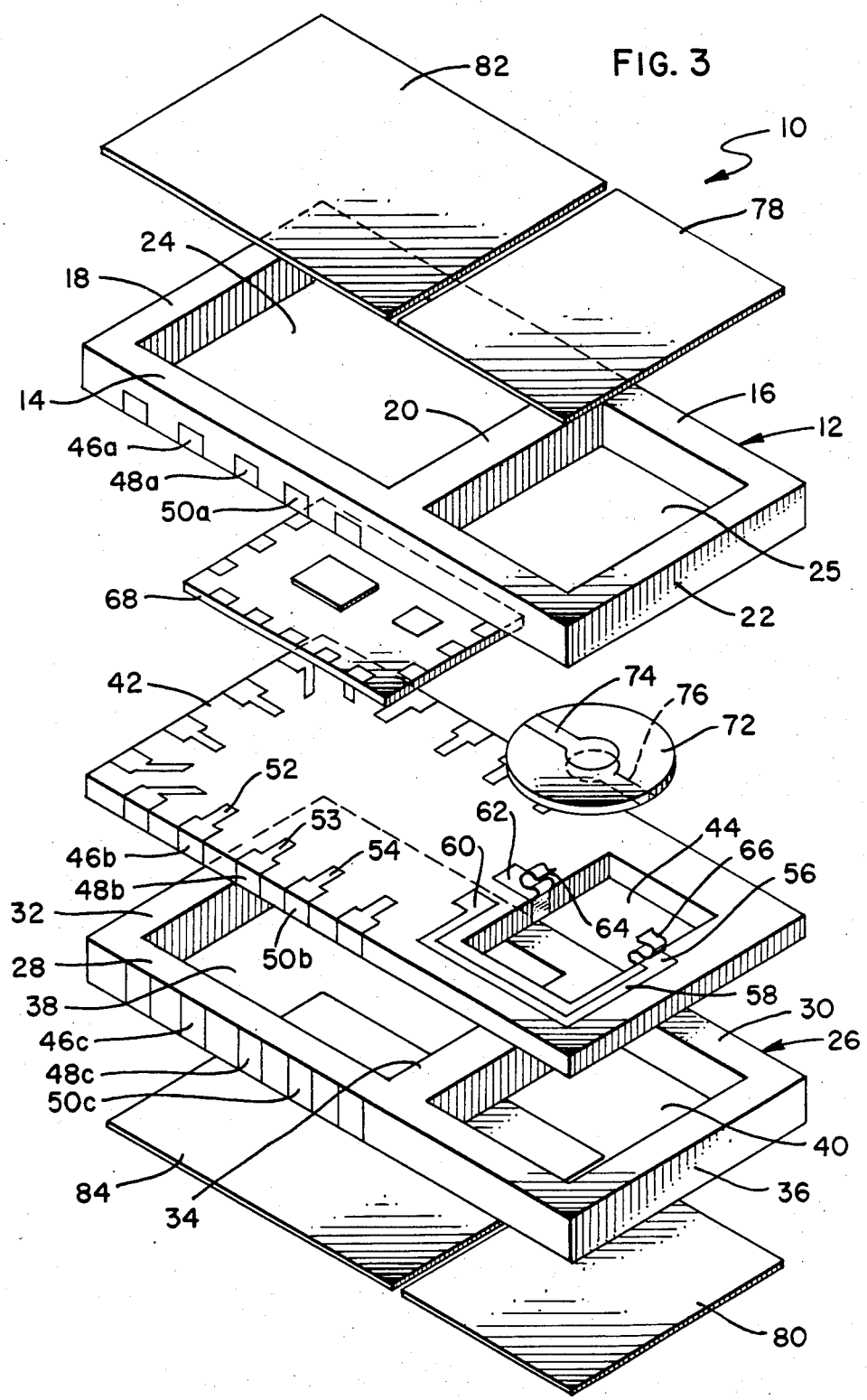
FIG. 3 is an exploded view of the parts which make up the package of this invention.

The ceramic package of this invention is generally indicated at 10 in FIGS. 1, 2 and 3. The main body of the package (without the covers) is made up of three parts. Upper body 12 is a rectangular frame having side rails 14 and 16 and cross rails 18, 20 and 22. These rails define openings 24 and 25. As will be seen, opening 24 becomes the first cavity for the oscillator network. The lower body 26 is of the same general construction with side rails 28 and 30 and cross rails 32, 34 and 36. These rails define openings 38 and 40. As described below, opening 38 becomes the third cavity for the compensation network.

Center plate 42 is a rectangular center plate having the same dimensional outlines as the upper and lower bodies. In addition, center plate 42 has an opening 44 therein which is in alignment with openings 25 and 40 to become the second cavity in which the oscillator crystal will be placed.

In ceramic package technology, these package parts are printed and stamped on ceramic sheet in plastic condition. Printing of leads on the ceramic parts in the plastic state is accomplished by employing metal powder containing ink. Thereupon, the upper body, center plate and lower body are assembled into the relationship shown in FIGS. 1 and 2 and the body assembly is fired. This firing vitrifies the ceramic with the conductive leads thereon. After the firing, the package is ready for subsequent assembly.

In the plastic state, appropriate leads and pads are printed for the type of package being produced. In the present case, the configuration is in the form of a leadless chip carrier with exterior pads. Exterior pads 46, 48 and 50 are shown as an example. In some cases, 15 pads will be required for contact to the crystal oscillator circuitry. In other cases, three pads are enough. Sufficient pads are provided to accomplish the desired result. As is seen in FIGS. 1 and 3, the pads 46, 48 and 50 extend over the outsides of the three body parts. In the manufacturing stage, these parts of pads are separately printed. Furthermore, as is seen in FIG. 3, a portion of the printing extends inward away from the edge of center plate 42 to form wire bonding pads 52, 53 and 54 on the top surface of the center plate and interiorly of the openings 24 and 25. Therefore, through-wall connections are accomplished. There are also wire bonding pads on the underside of plate 42, as indicated in FIG. 2, so that circuitry on the underside of that center plate can also achieve exterior connection. After the vitrification, the electrical pads remain so that connections can be made to the circuitry within the package. In addition, if necessary, vias are created through the center plate to achieve electrical connection between the circuitry above and below the center plate within openings 24 and 38. In addition, spring pads 55 and 56 are formed on the interior of opening 44 in the center plate. Spring pad 56 is connected through printed lead 58 to wire bonding pad 60, while spring pad 55 is connected through printed circuit to wire bonding pad 62. This printed circuitry completes the preparatory work on the upper body, center plate and lower body, and they are aligned and vitrified. It is during this vitrification procedure that the printed circuit portions become metal structures and the individual portions of the exterior pads, such as the portions 46a, 46b and 46c of the exterior pad 46 become the single pad 46 shown in FIG. 1. This action also occurs for the exterior pads 48 and 50.

After the three body parts are unified through vitrification, facing spring clamps 64 and 66 are respectively soldered or welded to pads 55 and 56. Next, the thin film hybrid oscillator network 68 and thick film compensation network 70 are mounted in place and connected. In conventional technology, these are aluminum oxide substrates with circuit components and chips thereon interconnected to accomplish the oscillator function. The compensation function is the same, but is formed of thick film technology so that it is not sensitive to moisture on the components. Suitable vias are employed and the hybrid substrates are secured in place. Wire bonding connects the hybrid circuits to exterior and interior connections, including to pads 60 and 62 for connection to the oscillator crystal.

Oscillator crystal 72 is a disc with electrode 74 deposited on its upper side and electrode 76 deposited on its lower side. Leads from these electrodes to the edges of the oscillator crystal permit electrical connection between the electrodes and the spring clamps 64 and 66, respectively. The openings in the three body parts form a second cavity which is an oscillator cavity in which the oscillator crystal lies.

The first procedure is to clean, adjust and seal the thin-film hybrid oscillator network in the first cavity. The thin-film network is adjusted for frequency, bias current and cold starting characteristics. The first cavity is now filled with dry nitrogen, or other inert gas, and the cover 82 is put in place and sealed by thermocompression bonding.

As the second procedure, with both of the covers 78 and 80 off, the oscillator crystal and its cavity are cleaned. The cavity is open both top and bottom to improve cleaning efficiency. The oscillator is held at a constant temperature and plating is vacuum-deposited onto the electrodes 74 and 76 as required to reach the desired frequency. Covers 78 and 80 are attached by thermocompression bonding, which is a procedure disclosed in Snow U.S. Pat. No. 3,951,327. The covers 78 and 80 are put in place in vacuuo to assure cleanliness of the oscillator crystal cavity.

The next procedure is to adjust the compensation network on the thick film hybrid circuitry on substrate 70. The reason a thick film circuit is used at this location instead of a thin film circuit is that the compensation network compensates the crystal and oscillator for variations in temperature. The package 10 and its contents are subjected to a range of temperature, which may cause condensation, and the compensation network on hybrid circuit substrate 70 is adjusted in order to provide for the desired frequency-versus-temperature response. The oscillator can be adjusted either to be temperature-dependent or temperature-independent. As a temperature-dependent circuit, its frequency output would be related to the ambient temperature to serve as an ambient temperature signal. On the other hand, the compensation network can be adjusted so that the oscillator frequency is constant, independent of temperature. The appropriate adjustment is made to the circuitry, while the oscillator crystal cavity and the oscillator network cavity are both sealed to protect them against the ambient contaminants. The thick film circuitry on substrate 70 can stand the difficult environment of temperature cycling. After the compensation network is adjusted, the cavity 34 is dried, filled with a clean, dry inert gas, and the lower cover 84 is thermocompression-bonded thereon.

When the compensation network 70 achieves its compensation through thermistors and other temperature-sensitive components, only three exterior contacts are required to power the oscillator and sense its frequency. On the other hand, when the compensation network is a digital system which uses a temperature sensor and a read-only memory relating the temperature to the correction, up to fifteen exterior contacts may be required for various functions, including the intial and subsequent loading of the memory containing the compensation information. A suitable socket is provided, and the ceramic package is placed in the socket to provide its frequency reference.

In this way, a small, single unitary package is provided which incorporates the oscillator crystal, the oscillator network and the compensation network so that a single device provides the desired frequency signal. In this way, a reliable, economic and easily exchangeable system is provided.

This invention has been described in its presently contemplated best mode, but it is clear that it is susceptible to numerous modifications, modes and embodiments within the ability of those skilled in the art and without the exercise of the inventive faculty. Accordingly, the scope of this invention is defined by the scope of the following claims.

What is claimed is:

1. A ceramic package comprising:
   an upper body, a center body and a lower body, said bodies being made of vitrified ceramic and joined together by vitrified ceramic;
   first and second openings in said upper body, first and second openings in said lower body and an opening in said center plate, said second openings in said upper and lower bodies being in communication with said opening in said center plate to define an oscillator crystal cavity, said first openings in said upper body and said lower body being out of communication with each other and out of communication with said oscillator crystal cavity to define an oscillator network cavity and a compensation network cavity; and cover means over each of said cavities to form separate closed oscillator crystal, oscillator network and compensation network cavities.

2. The ceramic package of claim 1 wherein said cover means comprises a separate cover for each of said first and second openings in each of said upper and lower bodies so as to close said openings to define three separate cavities.

3. The ceramic package of claim 2 wherein said covers are hermetically sealed onto said upper and lower bodies over the openings therein to define three hermetically sealed cavities.

4. The ceramic package of claim 1 wherein there are circuit strips deposited on at least one side of one of said plates to permit interconnection between electronic components.

5. The ceramic package of claim 4 wherein said deposited circuit strips include conductors adjacent the edges of said opening in said center plate and there are clamps having opposing faces physically secured to and electrically connected to said conductors adjacent said opening in said center plate so that said clamps can engage and carry an oscillator crystal between the faces thereof.

6. The ceramic package of claim 5 wherein there is an oscillator crystal mounted in said clamps and electrically connected to said clamps so that said oscillator crystal is retained in place in said oscillator crystal cavity.

7. The ceramic package of claim 6 wherein there is a cover over said oscillator crystal cavity in both said upper body and said lower body and each of said covers is thermocompression-bonded over said openings to hermetically seal said oscillator crystal in its cavity.

8. The ceramic package of claim 7 wherein there is a network in said first opening of said upper body and there is a network in the first opening of said lower body and there are covers hermetically sealed over said first openings so as to define enclosed cavities therein.

9. The ceramic package of claim 8 wherein said center plate includes conductors on the exterior surfaces of said center plate to permit electrical connection to circuitry enclosed in said ceramic package, and connections between upper and lower cavities.

10. An intermediate for processing into a ceramic package for a compensated crystal oscillator, said intermediate comprising upper and lower plastic ceramic bodies of rectangular configuration of substantially the same size and each having a first and a second opening therein, said upper body and said lower body each being of substantially uniform thickness away from said openings;

a center plate of plastic ceramic material, said center plate being of substantially rectangular configuration substantially the same size as said upper and lower bodies, said center plate having an opening therein which is in alignment with said second opening in said upper and lower bodies and out of alignment with said first openings in said upper and lower bodies, said center plate having electrically conductive material deposited thereon in desired conductive paths, including two paths from adjacent said opening in said center plate, so that said upper body, said center plate and said lower body can be stacked in substantial alignment and vitrified to form a single ceramic package for a compensated crystal oscillator wherein said package has three open cavities therein.

11. The intermediate of claim 10 wherein said printed circuitry extends around the edge of said center plate.

12. A compensated crystal oscillator ceramic package comprising:
a unitary ceramic package body of generally rectangular configuration and having a top and a bottom, a first cavity recessed into the top of said body and extending partway into said body to have a closed bottom;

a second cavity in the the top of said body, said second cavity extending through said body from the top to the bottom thereof;

a third cavity in the bottom of said body, said third cavity forming a recess having a closed bottom, each of said three cavities being isolated from each of the other cavities; and a first cover for said first cavity, a pair of covers for said second cavity, one for each opening thereof, and a third cover for said third cavity so that said covers can be hermetically sealed over said corresponding cavities to form three independent hermetic cavities.

13. The oscillator package of claim 12 wherein electrically conductive circuit paths are deposited upon the bottom of said first cavity, said electrically conductive paths extending into said second cavity so that an oscillator crystal can be mounted in said second cavity and an oscillator network can be placed in said first cavity and electrically connected to said oscillator crystal, and each of said cavities is separately independently hermetically sealed.

14. The oscillator package of claim 13 wherein there is an oscillator crystal mounted in said second cavity and an oscillator network mounted in said first cavity, said oscillator network being hermetically sealed from and electrically connected to said oscillator crystal.

15. The oscillator package of claim 14 wherein a compensation network is mounted in said third cavity and said compensation network is electrically connected to said oscillator network, said first and second cavities being hermetically sealed while said third cavity is open for adjustment of said compensation network.

16. The oscillator package of claim 15 wherein said compensation network is adjusted and a cover is hermetically sealed over said third cavity so as to form a single ceramic package having a compensated crystal oscillator therein.

* * * * *